(12) United States Patent
Seo et al.

(10) Patent No.: US 12,386,577 B2
(45) Date of Patent: Aug. 12, 2025

(54) TILING DISPLAY APPARATUS

(71) Applicant: LG Display Co., Ltd., Seoul (KR)

(72) Inventors: Chang Woo Seo, Paju-si (KR); Tae Gung Kim, Paju-si (KR); Dae Sung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/474,955

(22) Filed: Sep. 26, 2023

(65) Prior Publication Data
US 2024/0220181 A1    Jul. 4, 2024

(30) Foreign Application Priority Data

Dec. 29, 2022    (KR) .................. 10-2022-0188996

(51) Int. Cl.
| | | |
|---|---|---|
| *G06F 3/14* | (2006.01) | |
| *G09F 9/302* | (2006.01) | |
| *G09G 5/12* | (2006.01) | |
| *G09G 5/14* | (2006.01) | |
| *G09G 5/42* | (2006.01) | |
| *H03M 1/00* | (2006.01) | |

(52) U.S. Cl.
CPC .......... *G06F 3/1446* (2013.01); *H03M 1/001* (2013.01); *G06F 3/1423* (2013.01); *G09F 9/3026* (2013.01); *G09G 5/12* (2013.01); *G09G 5/14* (2013.01); *G09G 5/42* (2013.01); *G09G 2300/026* (2013.01); *G09G 2356/00* (2013.01); *G09G 2360/04* (2013.01)

(58) Field of Classification Search
None
See application file for complete search history.

(56) References Cited

U.S. PATENT DOCUMENTS

| | | | |
|---|---|---|---|
| 6,340,957 B1* | 1/2002 | Adler | G06F 1/1656 345/1.3 |
| 6,501,441 B1* | 12/2002 | Ludtke | H04N 21/4363 345/1.3 |
| 11,086,582 B1* | 8/2021 | Lizarazo Patino | G06F 3/0416 |
| 2005/0116667 A1* | 6/2005 | Mueller | G09F 19/22 315/312 |
| 2005/0178034 A1* | 8/2005 | Schubert | G06F 3/1446 40/605 |
| 2013/0176255 A1* | 7/2013 | Kim | G06F 3/04883 345/173 |

(Continued)

FOREIGN PATENT DOCUMENTS

CN 101017393 A * 8/2007

*Primary Examiner* — Patrick N Edouard
*Assistant Examiner* — Peijie Shen
(74) *Attorney, Agent, or Firm* — Seed Intellectual Property Law Group LLP

(57) ABSTRACT

A tiling display apparatus includes a plurality of display modules connected with one another to configure a tiling screen and display division images and a system chip configured to change a display position of each of the division images, based on module arrangement information about each of the plurality of display modules, wherein seam patterns are configured to be coupled with adjacent display modules are provided in border regions of each display module, and each display module obtains, as the module arrangement information, connection state information about the seam patterns.

17 Claims, 11 Drawing Sheets

(56) References Cited

U.S. PATENT DOCUMENTS

| | | | | |
|---|---|---|---|---|
| 2013/0241801 | A1* | 9/2013 | Petrik | G06F 3/1423 |
| | | | | 345/1.1 |
| 2013/0241954 | A1* | 9/2013 | Yu | G06F 3/1446 |
| | | | | 345/1.3 |
| 2013/0271352 | A1* | 10/2013 | Wu | G06F 1/1652 |
| | | | | 345/1.1 |
| 2014/0218348 | A1* | 8/2014 | Khongbantabam | G09G 5/003 |
| | | | | 345/212 |
| 2014/0253417 | A1* | 9/2014 | Brown | G06F 3/1446 |
| | | | | 345/2.3 |
| 2015/0301781 | A1* | 10/2015 | Ekkaia | F21V 17/105 |
| | | | | 362/237 |
| 2016/0163018 | A1* | 6/2016 | Wang | G06T 1/20 |
| | | | | 345/504 |
| 2016/0291918 | A1* | 10/2016 | Nagano | G06F 3/1446 |
| 2016/0342373 | A1* | 11/2016 | Huang | H05K 5/0065 |
| 2016/0342376 | A1* | 11/2016 | Liang | G09G 5/003 |
| 2018/0060013 | A1* | 3/2018 | Son | G06F 3/1446 |
| 2018/0181252 | A1* | 6/2018 | Park | G09G 3/2092 |
| 2019/0018637 | A1* | 1/2019 | Cheon | G06F 3/1446 |
| 2019/0114949 | A1* | 4/2019 | Childs | G06F 3/1446 |
| 2020/0057595 | A1* | 2/2020 | Wu | G06F 3/1446 |
| 2020/0193943 | A1* | 6/2020 | Iversen | G09G 3/32 |
| 2020/0241828 | A1* | 7/2020 | Noyelle | G09G 3/3208 |
| 2020/0251048 | A1* | 8/2020 | Im | H10H 29/142 |
| 2021/0116966 | A1* | 4/2021 | Clark | G06F 1/266 |
| 2022/0066728 | A1* | 3/2022 | Oshima | G06F 1/1641 |
| 2023/0120557 | A1* | 4/2023 | Khen | G06F 3/04897 |
| | | | | 345/156 |
| 2023/0236785 | A1* | 7/2023 | Joo | G09G 3/2096 |
| | | | | 345/1.3 |

* cited by examiner

TILING DISPLAY APPARATUS

CROSS-REFERENCE TO RELATED APPLICATIONS

This application claims the benefit of the Korean Patent Application No. 10-2022-0188996 filed on Dec. 29, 2022, which is hereby incorporated by reference as if fully set forth herein.

BACKGROUND

Technical Field

The present disclosure relates to a tiling display apparatus capable of expanding.

Description of the Related Art

Large-sized displays may be used in various fields such as indoor and outdoor digital advertisements. In order to satisfy the demands for large-sized displays, tiling display apparatuses capable of being expanded have been proposed. In tiling display apparatuses, a tiling screen is configured by connecting a plurality of display modules, and a desired tiling screen size may be implemented by adjusting the number of display modules connected to one another. A tiling screen is implemented with division images by display modules.

A user may change arrangement positions of display modules configuring a tiling display apparatus to implement a desired screen shape, for various purposes. In this case, a shape of a tiling screen configured by a combination of display modules may be changed to a free-form shape instead of a tetragonal shape.

BRIEF SUMMARY

Despite the various benefits of a tiling screen, when positions of division images are not adjusted based on changing of a shape of a tiling screen, a free-form screen and division images are mismatched with one another, and due to this, a display image by a tiling screen may be distorted.

To overcome the various technical problems in the related including the aforementioned problem, various embodiments of the present disclosure may provide a tiling display apparatus which may sense arrangement positions of display modules and may automatically adjust positions of division images, based on a sensing result thereof.

To achieve these technical benefits and other advantages, as embodied and broadly described herein, a tiling display apparatus includes a plurality of display modules connected with one another to configure a tiling screen and display division images and a system chip configured to change a display position of each of the division images, based on module arrangement information about each of the plurality of display modules, wherein seam patterns capable of being connected with adjacent display modules are provided in border regions of each display module, and each display module obtains, as the module arrangement information, connection state information about the seam patterns.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
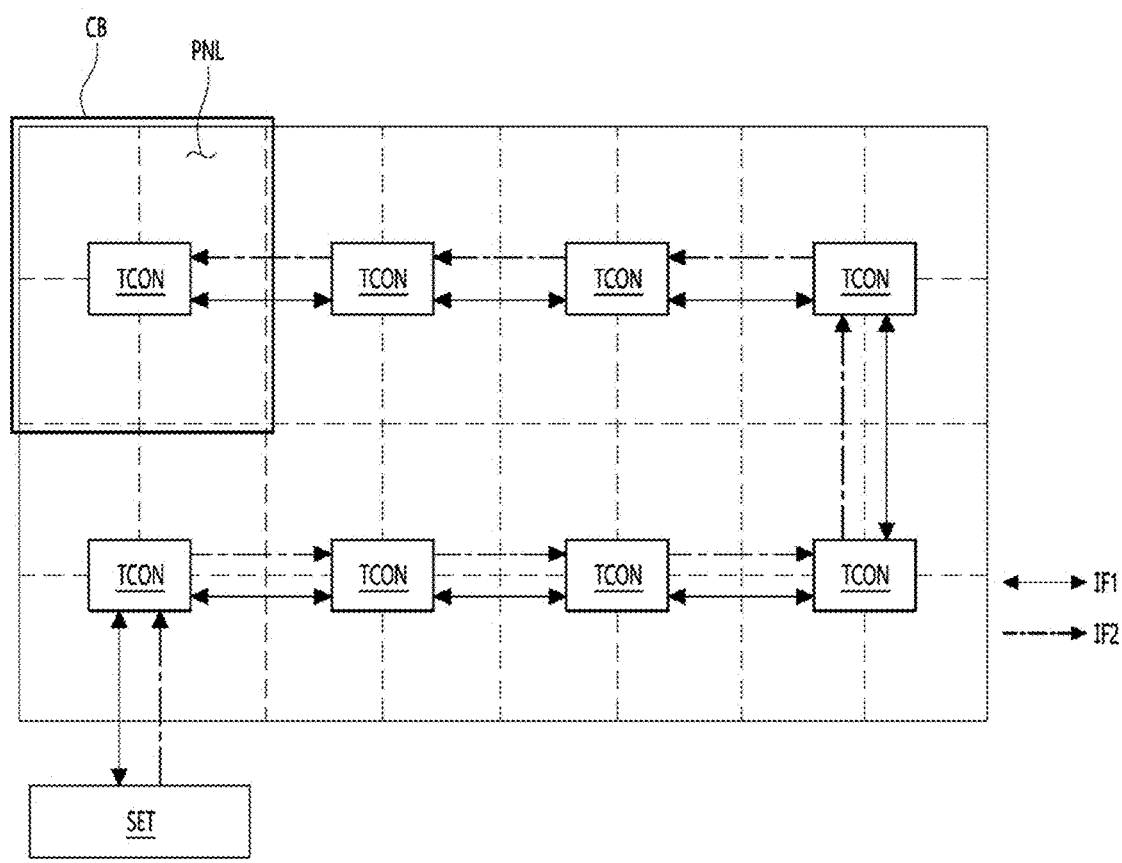
FIG. 1 is a diagram schematically illustrating a tiling display apparatus according to the present embodiment.

Hereinafter, the present disclosure will be described more fully with reference to the accompanying drawings, in which exemplary embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

The shapes, sizes, ratios, angles, numbers and the like disclosed in the drawings for description of various embodiments of the present disclosure to describe embodiments of the present disclosure are merely exemplary and the present disclosure is not limited thereto. Like reference numerals refer to like elements throughout. Throughout this specification, the same elements are denoted by the same reference numerals. As used herein, the terms "comprise," "having," "including" and the like suggest that other parts can be added unless the term "only" is used. As used herein, the singular forms "a," "an," and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on-," "over-," "under-," and "next-," one or more other parts may be disposed between the two parts unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the following description, when the detailed description of the relevant known function or configuration is determined to unnecessarily obscure the important point of the present disclosure, the detailed description will be omitted. Hereinafter, embodiments of the present disclosure will be described in detail with reference to the accompanying drawings.

Figure 2:
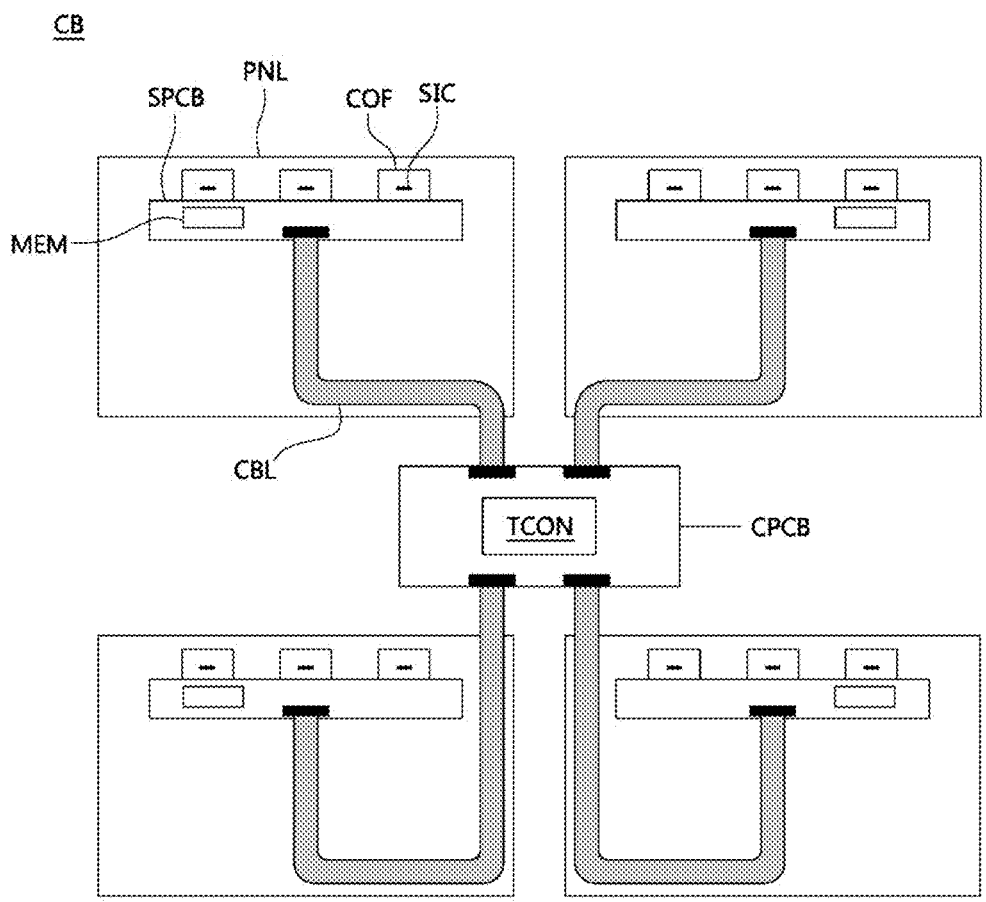
FIG. 2 is a diagram illustrating a connection configuration of a display module.

FIG. 1 is a diagram schematically illustrating a tiling display apparatus 100 according to an embodiment of the present disclosure. FIG. 2 is a diagram illustrating a connection configuration of a display module.

Referring to FIGS. 1 and 2, the tiling display apparatus 100 according to an embodiment of the present disclosure may include a system circuit SET (also referred to as a system chip SET) and a plurality of display modules CB. Each of the display modules CB may include a plurality of display panels PNL. The display module CB may be referred to as a cabinet.

The display modules CB may be connected with one another through an interface circuit to configure a tiling screen. The titling screen may refer to the tile-shaped display modules CB combined together to operate as a single large display. Each of the display modules CB of the tiling screen may also be operated to display respective images or videos from respective display modules. A total resolution of the tiling screen may be determined as a total sum of module resolutions implemented in the display modules CB. For example, in a case where a tiling screen is configured by eight display modules CB having a module resolution of 960 (width)*1080 (height), a total resolution of the tiling screen may be 3840 (width)*2160 (height).

The display modules CB may be connected with one another through a bidirectional first interface circuit IF1 based on a bidirectional serial communication scheme, so as to execute a target operation corresponding to a control command signal input from the system chip SET. The bidirectional first interface circuit IF1 may be implemented as a bidirectional multi-chain interface of a feedback loop type between adjacent display modules CB. Individual bidirectional serial communication between display modules CB may be performed by the bidirectional first interface circuit IF1, and thus, a short communication line may be secured and the speed and reliability of large-capacity data communication based on a short communication line may be enhanced. The bidirectional first interface circuit IF1 may be implemented as a dual serial peripheral interface (SPI), but is not limited thereto.

One of the display modules CB may be connected with the system chip SET through the bidirectional first interface circuit IF1. When the bidirectional first interface circuit IF1 is applied between the display module CB and the system chip SET, a communication speed between the display module CB and the system chip SET may increase.

The system chip SET may sequentially transfer image data, which is to be divisionally displayed through the display modules CB, to the display modules CB through a second interface circuit IF2. The second interface circuit IF2 may be implemented based on a V-by-One (V×1) scheme capable of high-speed and large-capacity interfacing, but is not limited thereto.

The system chip SET may change display positions of division images, based on module arrangement information transferred from the display modules CB, and thus, may enable an output image to be displayed on a tiling screen without distortion even when arrangement positions of the display modules CB are changed.

Each display module CB may include a plurality of display panels PNL, panel driving circuits for driving the display panels PNL, and a timing controller TCON which controls an operation timing of each of the panel driving circuits.

Each of the display panels PNL may be implemented as a micro light emitting diode (LED)-based electroluminescent display type, but is not limited thereto and may be implemented with light emitting devices including a micro-LED.

The timing controllers TCON included in the display modules CB may be connected with one another through the first and second interface circuits IF1 and IF2. The timing controller TCON of each display module CB may be mounted on a control printed circuit board (PCB) CPCB and may be connected to the panel driving circuits of a corresponding display module CB through a branch cable CBL.

The panel driving circuit may be individually connected to each of the plurality of display panels PNL configuring the same display module CB. The panel driving circuit may include a source PCB SPCB connected with the timing controller TCON through the branch cable CBL, a memory circuit MEM mounted on the source PCB SPCB, a conductive film COF electrically connecting the source PCB SPCB with the display panel PNL, a data driver SIC bonded on the conductive film COF, and a gate driver and a power circuit electrically connected to the source PCB SPCB.

The memory circuit MEM may be a non-volatile memory which stores a panel characteristic and may be flash memory and/or electrically erasable programmable read-only memory (EEPROM), which store(s) a correction value for gamma setting, a first compensation value for compensating for a driving characteristic deviation/color deviation between pixels, a second compensation value for compensating for a boundary deviation between adjacent display panels PNL, various image qualities, and driving control data. In this case, a high amount of data may be stored in flash memory, and a low amount of data may be stored in EEPROM.

The timing controller TCON may operate the panel driving circuit on the basis of a control command signal transferred from the system chip SET through the first interface circuit IF1 to execute a target operation corresponding to the control command signal and may generate a control response signal including an execution result of the target operation. The target operation may include reset, mute (dark change), average picture level (APL) range change, gamma change, image quality compensation value update, and firmware update. The target operation may further include an operation of writing and storing control command data in a specific memory and an operation of reading control execution data from a specific memory.

The timing controller TCON may obtain module arrangement information about a display module CB including a corresponding timing controller TCON, based on a control command signal transferred from the system chip SET through the first interface circuit IF1, and then, may store the obtained module arrangement information in the memory circuit MEM. Also, the timing controller TCON may read the module arrangement information from the memory circuit MEM, based on the control command signal transferred from the system chip SET through the first interface circuit IF1, and may transfer the module arrangement information to the system chip SET through the first interface circuit IF1.

The timing controller TCON may control an operation of the panel driving circuit so that division image data transferred through the second interface circuit IF2 is displayed on the display panels PNL.

Figure 3:
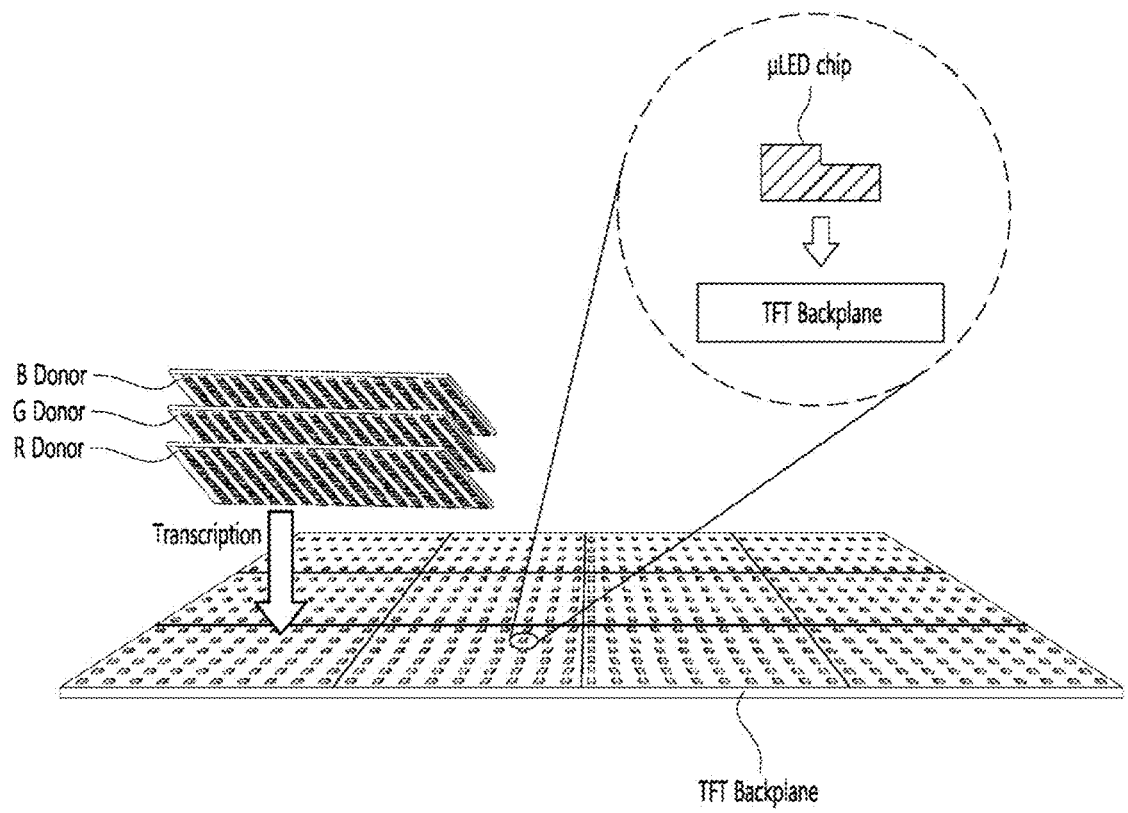
FIGS. 3 and 4 are diagrams illustrating a display panel based on a micro light emitting diode (LED)
Figure 4:
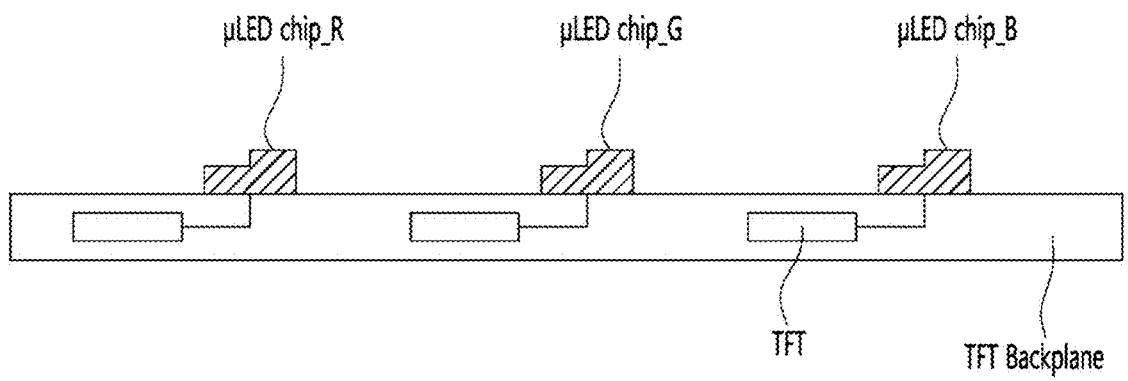
Figure 5:
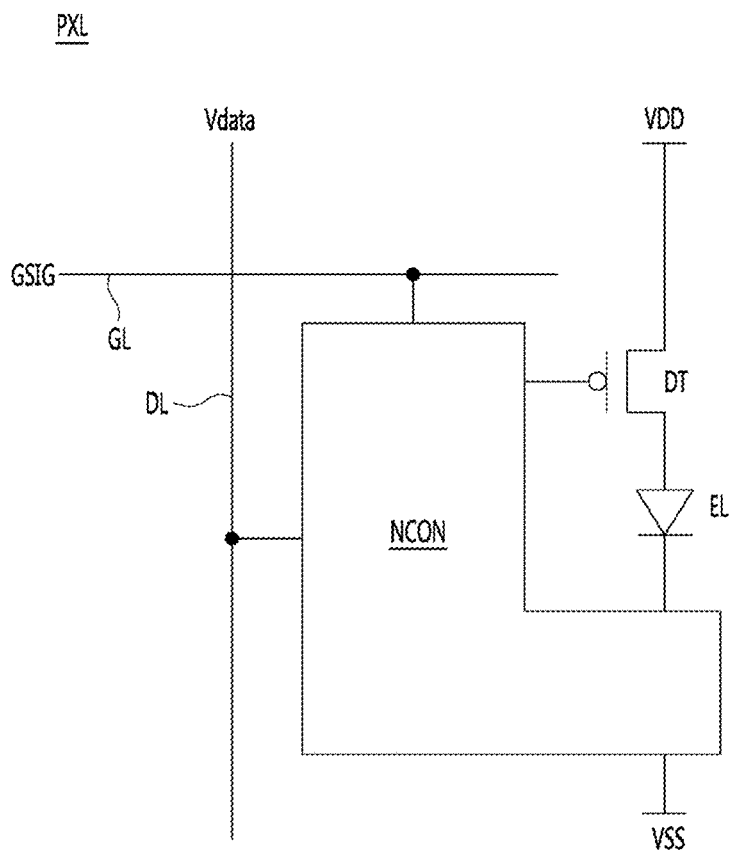
FIG. 5 is a schematic equivalent circuit diagram of a pixel included in a display panel.

FIGS. 3 and 4 are diagrams illustrating a display panel based on a micro-LED. FIG. 5 is a schematic equivalent circuit diagram of a pixel included in a display panel.

Referring to FIGS. 3 and 4, a pixel array for displaying a division image may be provided in each of the display panels PNL. A plurality of pixels may be arranged in the pixel array, and signal lines for driving the pixels may be arranged in the pixel array. The signal lines may include a plurality of data lines DL for supplying data voltages Vdata to the pixels, a plurality of gate lines GL for supplying a gate signal GSIG to the pixels, and a plurality of power lines for supplying a source voltage to the pixels.

Each of the pixels may include a micro-LED chip (μLED chip) as a light emitting device EL. A plurality of micro-LED chips (μLED chip) may include red chips (μLED chip_R), green chips (μLED chip_G), and blue chips (μLED chip_B), which are disposed on a thin film transistor (TFT) backplane. A red (R) pixel may include a red chip (μLED chip_R) as a light emitting device EL, a green (G) pixel may include a green chip (μLED chip_G) as a light emitting device EL, and a blue (B) pixel may include a blue chip (μLED chip_B) as a light emitting device EL.

The micro-LED chips (μLED chip) may be transferred from R/G/B donors, and thus, may be mounted on a TFT backplane. The red chips (μLED chip_R) may be transferred from an R donor, the green chips (μLED chip_G) may be transferred from a G donor, and the blue chips (μLED chip_B) may be transferred from a B donor. Transfer technology may use an electrostatic force, a laser, a speed-dependent tacky force, and a load-dependent tacky force. The transfer technology is not limited thereto and may use self-assembly based on an electrostatic force.

The TFT backplane may be implemented in an active matrix structure for efficient driving. In the TFT backplane, the pixels may be defined by the data lines DL, the gate lines GL, and the power lines.

A plurality of pixels may configure one unit pixel. For example, R, G, and B pixels arranged adjacent thereto may configure one unit pixel in an extension direction of the gate line GL or an extension direction of the data line DL.

As in FIG. 5, a pixel PXL may include a light emitting device EL, a driving TFT DT, and a node circuit NCON.

The node circuit NCON may be connected with the gate line GL and the data line DL. The node circuit NCON may be supplied with the data voltage Vdata through the data line DL and may be supplied with the gate signal GSIG through the gate line GL. The node circuit NCON may apply the data voltage Vdata to a gate electrode of the driving TFT DT in synchronization with the gate signal GSIG, and thus, may set a gate-source voltage of the driving TFT DT on the basis of a condition for generating a driving current. The node circuit NCON may include an internal compensation circuit which senses and compensates for a threshold voltage and/or electron mobility of the driving TFT DT.

The driving TFT DT may be a driving element which generates the driving current on the basis of the gate-source voltage thereof. The gate electrode of the driving TFT DT may be connected with the node circuit NCON, a first electrode (e.g., a drain electrode) thereof may be connected with a high level pixel power VDD, and a second electrode (e.g., a source electrode) thereof may be connected with a light emitting device EL.

The light emitting device EL may be a light emitting device which emits light having strength corresponding to the driving current input to the driving TFT DT. The light emitting device EL may be implemented with a micro-LED including an inorganic light emitting layer. A first electrode of the light emitting device EL may be connected with the driving TFT DT, and a second electrode thereof may be connected with a low level pixel power VSS.

A connection configuration and an operation of one pixel PXL may be merely an embodiment, and the spirit of the present disclosure is not limited thereto. For example, each of the driving TFT DT and the node circuit NCON may be implemented based on a PMOS transistor, or may be implemented based on an NMOS transistor. Also, the gate line GL connected to the node circuit NCON may be provided in plurality.

Figure 6:
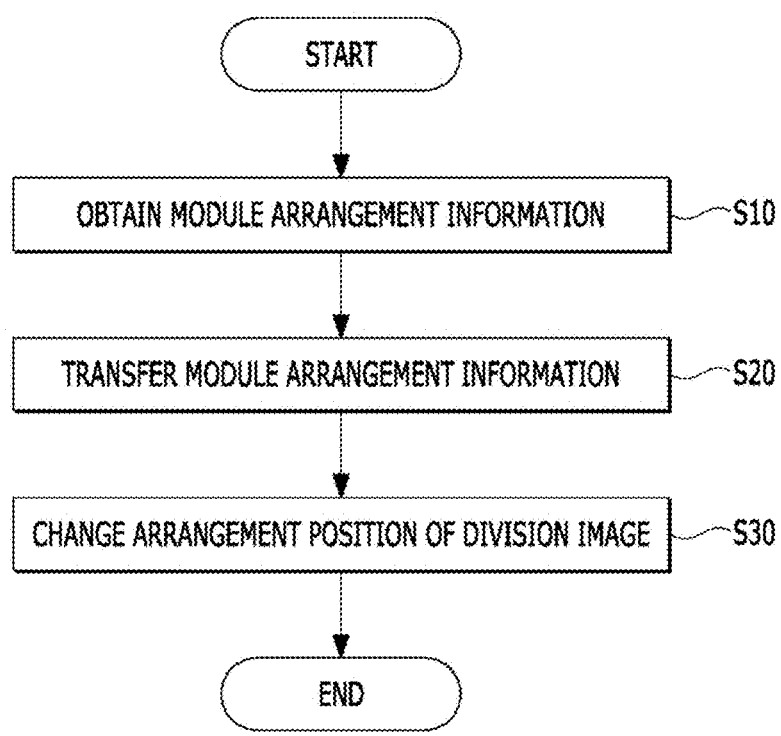
FIG. 6 is a diagram schematically illustrating an operation of sensing arrangement positions of display modules and automatically adjusting a display position of a division image on the basis of a sensing result thereof, in a tiling display apparatus according to an embodiment of the present disclosure.

FIG. 6 is a diagram schematically illustrating an operation of sensing arrangement positions of display modules and automatically adjusting a display position of a division image on the basis of a sensing result thereof, in a tiling display apparatus according to an embodiment of the present disclosure.

Referring to FIG. 6, in a tiling display apparatus according to the present embodiment, each display module may obtain module arrangement information thereof on the basis of a control command from a system chip SET, and then, may store the module arrangement information in a memory. Each display module may sense, as module arrangement information, connection state information about seam patterns included in border regions thereof (S10).

Each display module may read the module arrangement information from the memory according to a control command from the system chip SET, and then, may transfer the module arrangement information to the system chip SET through a first interface circuit (S20).

The system chip SET may calculate arrangement coordinates of the display modules, based on the module arrangement information transferred from the display modules, and may change a display position of a division image to match the arrangement coordinates (S30).

Figure 7:
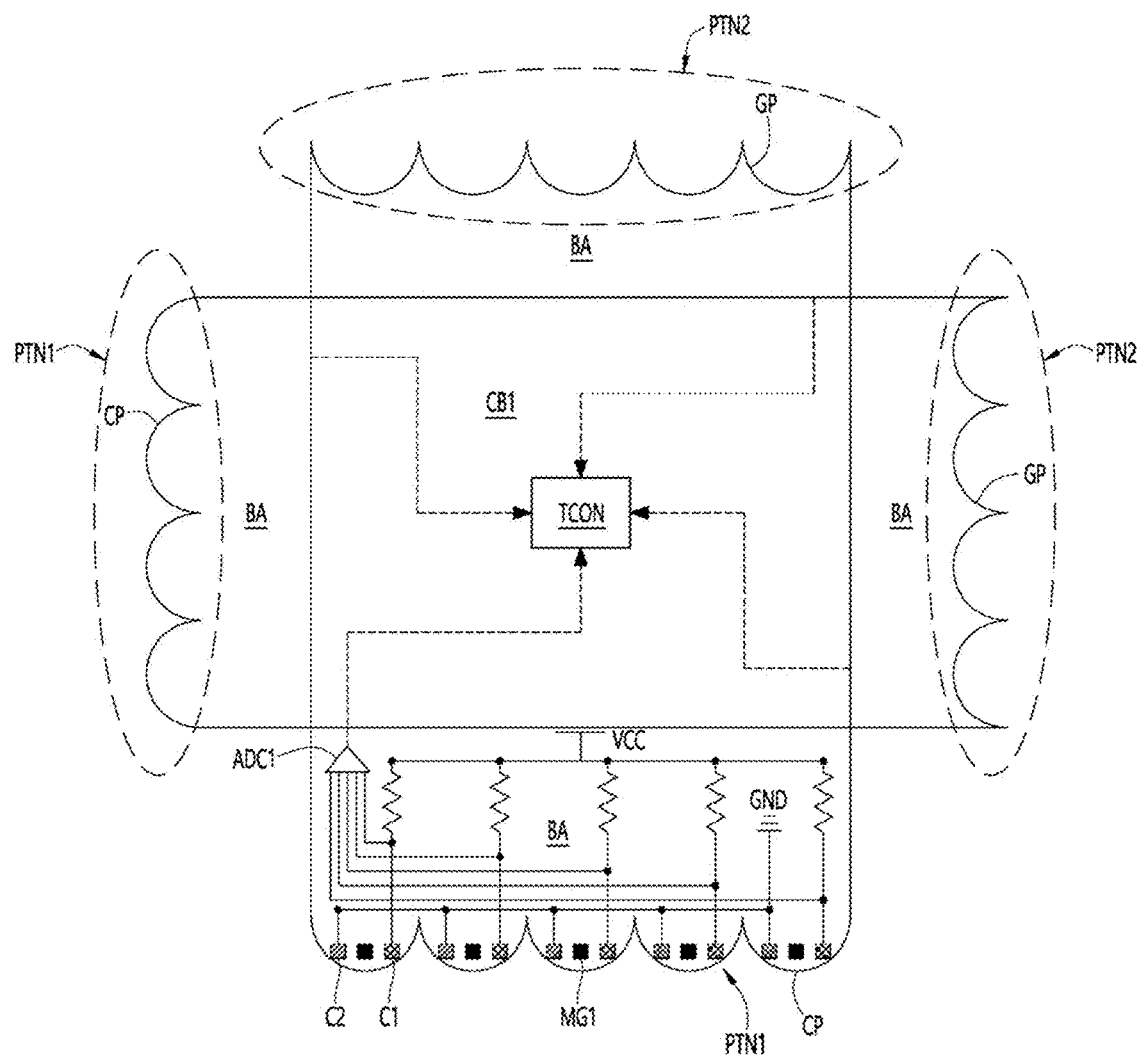
FIG. 7 is a diagram illustrating a border region configuration of a first display module for sensing a connection state with an adjacent display module.
Figure 8:
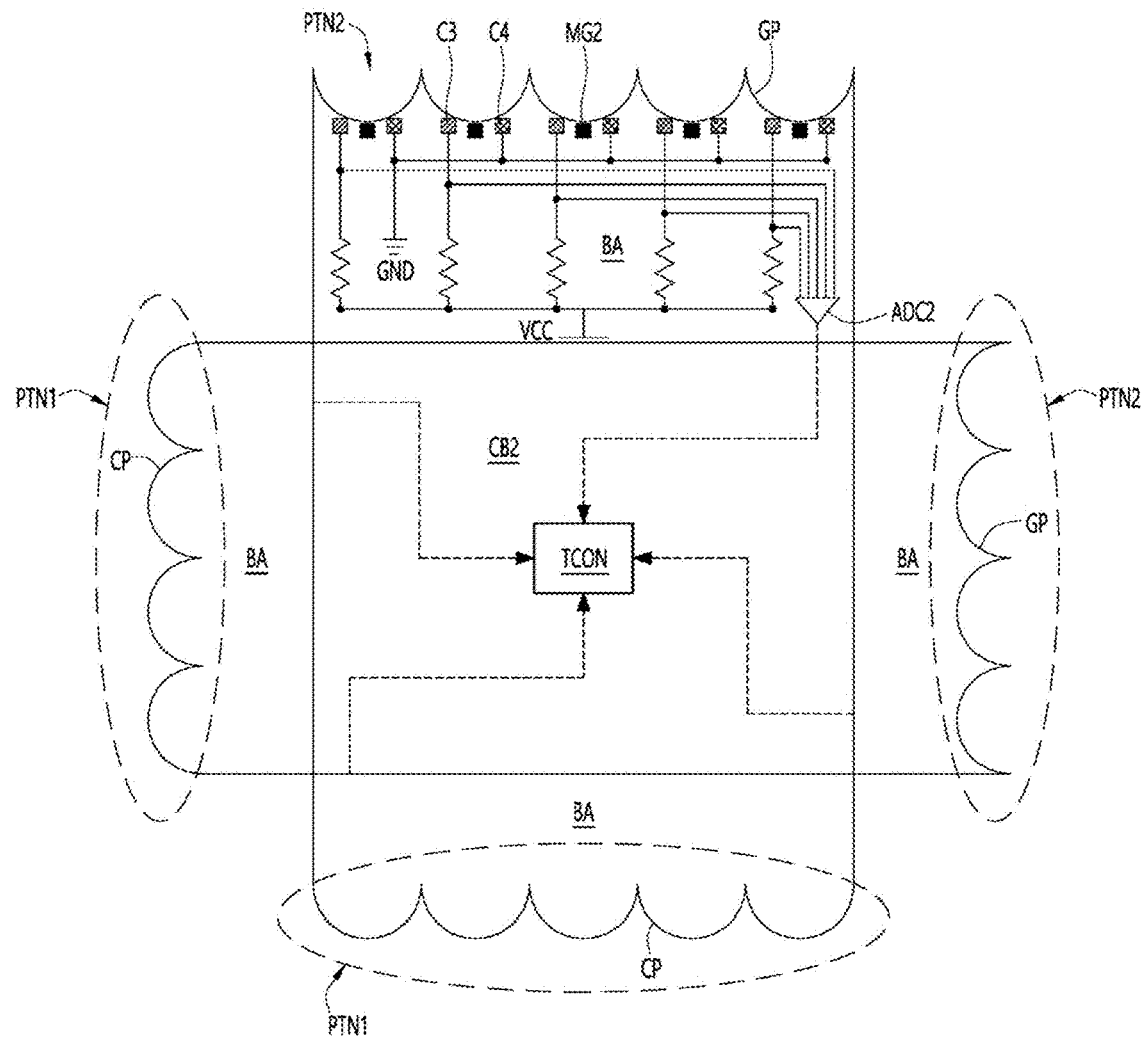
FIG. 8 is a diagram illustrating a border region configuration of a second display module for sensing a connection state with an adjacent display module.

FIG. 7 is a diagram illustrating a border region configuration of a first display module for sensing a connection state with an adjacent display module. FIG. 8 is a diagram illustrating a border region configuration of a second display module for sensing a connection state with an adjacent display module In FIGS. 7 and 8, border regions BA are exaggeratedly illustrated, but the border regions BA may be designed to be small so that a dead zone (e.g., a bezel) is minimized, in connecting display modules with each other.

Referring to FIGS. 7 and 8, a first display module CB1 may include four border regions BA which may be connected with adjacent display modules. A second display module CB2 may also include four border regions BA which may be connected with adjacent display modules. In each of the first and second display modules CB1 and CB2, the four border regions BA may be upper, lower, left, and right border regions BA.

For easily connecting between adjacent display modules, some of four border regions BA may include a first seam pattern PTN1, and the other border regions BA may include a second seam pattern PTN2. The first seam pattern PTN1 has a pattern of a first type and the second seam pattern PTN2 has a pattern of a second type different from the first type. For instance, the first seam pattern PTN1 and the second seam pattern PTN2 may have opposite shapes to engage each other. In some instances, first seam pattern PTN1 and the second seam pattern PTN2 have opposite shapes that complement each other such that when these shapes engage with each other a surface of the first seam pattern PTN1 and a corresponding surface of the second seam pattern PTN2 match. For example, a first seam pattern PTN1 of a first display module CB1 may engage a second seam pattern PTN2 of a second display module CB2 that is adjacent to the first display module CB1.

The first seam pattern PTN1 may include a plurality of protrusion portions CP which are convex toward the outsides of the first and second display modules CB1 and CB2. A width of one protrusion portion CP may be a horizontal interval resolution or a vertical interval resolution. The number of protrusion portions CP may correspond to the number of bits of connection state information.

The second seam pattern PTN2 may include a plurality of groove portions GP which are concave toward the insides of the first and second display modules CB1 and CB2. A width of one groove portion GP may be a horizontal interval resolution or a vertical interval resolution. The number of groove portions GP may correspond to the number of bits of the connection state information.

In the present embodiment, the protrusion portions CP and the groove portions GP are illustrated in a semispherical shape, but are not limited thereto and may have various shapes and structures that allows the protrusion portions CP and the groove portions GP to engage with each other.

The first seam pattern PTN1 of each of the first and second display modules CB1 and CB2 may be configured to be equal to the protrusion portions CP illustrated in FIG. 7. First connection terminals C1 connected with a high level logic power VCC and second connection terminals C2 connected with a ground power GND may be provided in the protrusion portions CP. The first and second connection terminals C1 and C2 may include a conductive material.

The second seam pattern PTN2 of each of the first and second display modules CB1 and CB2 may be configured to be equal to the groove portions GP illustrated in FIG. 8. Third connection terminals C3 connected with the high level logic power VCC and fourth connection terminals C4 connected with the ground power GND may be provided in the groove portions GP. The third and fourth connection terminals C3 and C4 may include a conductive material.

In FIG. 7, only a configuration of a lower border region BA of the first display module CB1 is illustrated in detail. In FIG. 7, only a configuration of an upper border region BA of the second display module CB2 is illustrated in detail. However, a configuration of a left border region BA of the first display module CB1 and configurations of left and lower border regions BA of the second display module CB2 may be substantially the same as the configuration of the lower border region BA of the first display module CB1. Also, configurations of upper and right border regions BA of the first display module CB1 and a configuration of a right border region BA of the second display module CB2 may be substantially the same as the configuration of the upper border region BA of the second display module CB2.

A plurality of engagement reinforcement portions MG1 and MG2 for reinforcing coupling between the first seam pattern PTN1 and the second seam pattern PTN2 in connecting adjacent display modules with each other may be further provided in the border regions BA of the first and second display modules CB1 and CB2. The engagement reinforcement portions MG1 and MG2 may be implemented with first polar magnets MG1 installed in the protrusion portions CP and second polar magnets MG2 installed in the groove portions GP. Coupling between the first seam pattern PTN1 and the second seam pattern PTN2 may be solidified by a strong magnetic force between the engagement reinforcement portions MG1 and MG2, and thus, first connection state information about the first seam pattern PTN1 and second connection state information about the second seam pattern PTN2 may be accurately obtained. The magnetic force that is applied may be sufficient force to couple the first seam pattern PTN1 and the second seam pattern PTN2 and hold the first and second display modules CB1 and CB2 together.

Optionally, first and second analog-to-digital converters ADC1 and ADC2 may be further provided in the border regions BA of the first and second display modules CB1 and CB2. The first analog-to-digital converter ADC1 may convert the first connection state information about the first seam pattern PTN1 into a digital signal, and the second analog-to-digital converter ADC2 may convert the second connection state information about the second seam pattern PTN2 into a digital signal. The first and second connection state information converted into the digital signals may be respectively supplied to timing controllers TCON included in the first and second display modules CB1 and CB2.

In each of the first and second display modules CB1 and CB2, four analog-to-digital converters ADC1 and ADC2 provided in four border regions BA may be replaced with one integration analog-to-digital converter. In this case, a multiplexer may be further connected with a front end of an integration analog-to-digital converter, for sequential processing on four pieces of connection state information.

The timing controller TCON provided in the first display module CB1 may receive upper, lower, left, and right connection state information from the four border regions BA of the first display module CB1, respectively. The upper, lower, left and right connection state information sensed from the four border regions BA of the first display module CB1 may include two pieces of first connection state information and two pieces of second connection state information.

Likewise, the timing controller TCON provided in the second display module CB2 may receive upper, lower, left, and right connection state information from the four border regions BA of the second display module CB2, respectively. The upper, lower, left, and right connection state information sensed from the four border regions BA of the second display module CB2 may include two pieces of first connection state information and two pieces of second connection state information.

Figure 9:
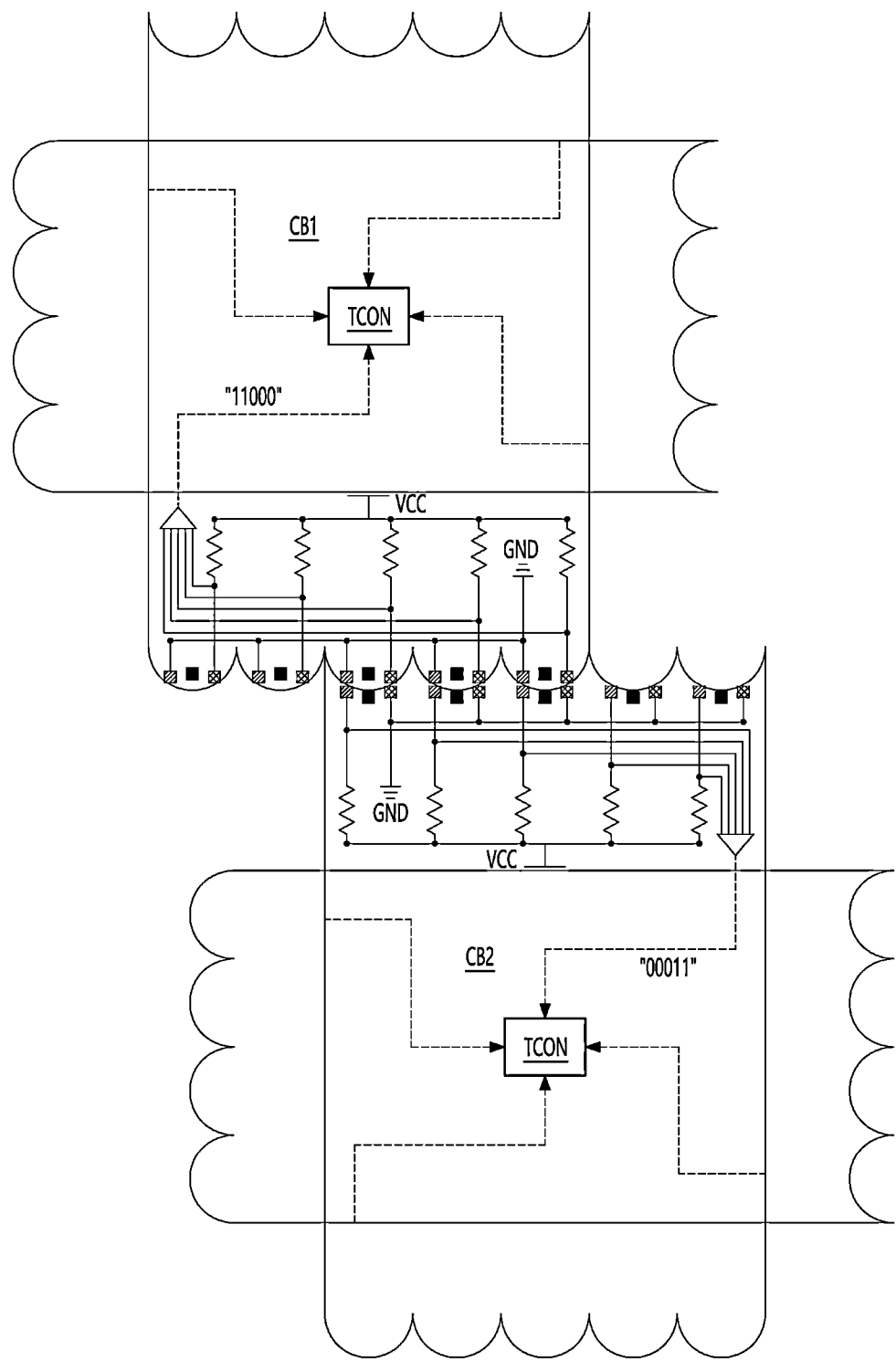
FIG. 9 is a diagram illustrating first connection state information and second connection state information generated when a first border region of a first display module illustrated in FIG. 7 is partially connected with a second border region of a second display module illustrated in FIG. 8.

FIG. 9 is a diagram illustrating first connection state information and second connection state information generated when the first border region of the first display module CB1 illustrated in FIG. 7 is partially connected with the second border region of the second display module CB2 illustrated in FIG. 8.

Referring to FIGS. 7 to 9, the first border region of the first display module CB1 may be a lower border region BA, and the second border region of the second display module CB2 may be an upper border region BA.

First connection state information about the first seam pattern PTN1 included in the first display module CB1 may be determined based on the number of first connection terminals C1 electrically connected with the fourth connection terminals C4. For example, in FIG. 9, the first connection state information about the first seam pattern PTN1 may be "11000." Connection terminals, which are not connected with the fourth connection terminals C4 of the second seam pattern PTN2, of the first connection terminals C1 of the first seam pattern PTN1 may be output as a bit value "1," and contrariwise, connection terminals, which are connected with the fourth connection terminals C4 of the second seam pattern PTN2, of the first connection terminals C1 of the first seam pattern PTN1 may be output as a bit value "0."

Second connection state information about the second seam pattern PTN2 included in the second display module CB2 may be determined based on the number of third connection terminals C3 electrically connected with the second connection terminals C2. For example, in FIG. 9, the second connection state information about the second seam pattern PTN2 may be "00111." Connection terminals, which are not connected with the second connection terminals C2 of the first seam pattern PTN1, of the third connection terminals C3 of the second seam pattern PTN2 may be output as a bit value "1," and contrariwise, connection terminals, which are connected with the second connection terminals C2 of the first seam pattern PTN1, of the third connection terminals C3 of the second seam pattern PTN2 may be output as a bit value "0."

As described above, the first and second connection state information about the first and second seam patterns PTN1 and PTN2 may represent relative arrangement positions of the first and second display modules CB1 and CB2.

Further, referring to FIG. 9, the first seam pattern PTN1 and the second seam pattern PTN2 include a complementary shape when, in operation, couples the first seam pattern PTN1 of the first display module CB1 with the second seam pattern PTN2 of the second display module CB2 at common border regions of the first and second display modules.

Here, some of the protrusion portions of the first seam pattern PTN1 interlock with some of the groove portions of the second seam pattern PTN2 (e.g., in the illustrated drawings, 3 protrusion portions interlock with 3 groove portions). The first seam pattern PTN1 includes first connection terminals C1 coupled with a high level logic power and second connection terminals C2 coupled with a ground power. Similarly, the second seam pattern includes third connection terminals C3 coupled with the high level logic power and fourth connection terminals C4 coupled with the ground power. In the interlocking process, at least some of the first connection terminals C1 of the first seam pattern PTN1 of the first display module CB1 are coupled with at least some of the fourth connection terminals C4 of the second seam pattern PTN2 of the second display module CB2. Similarly, at least some of the second connection terminals C2 of the first display module CB1 are coupled with at least some of the third connection terminals C3 of the second seam pattern PTN2 of the second display module CB2. The first polar magnets MG1 of the first seam pattern PTN1 couples with the second polar magnets MG2 of the second seam pattern PTN2 based on magnetic force to keep the two display modules CB1, CB2 in place.

Figure 10:
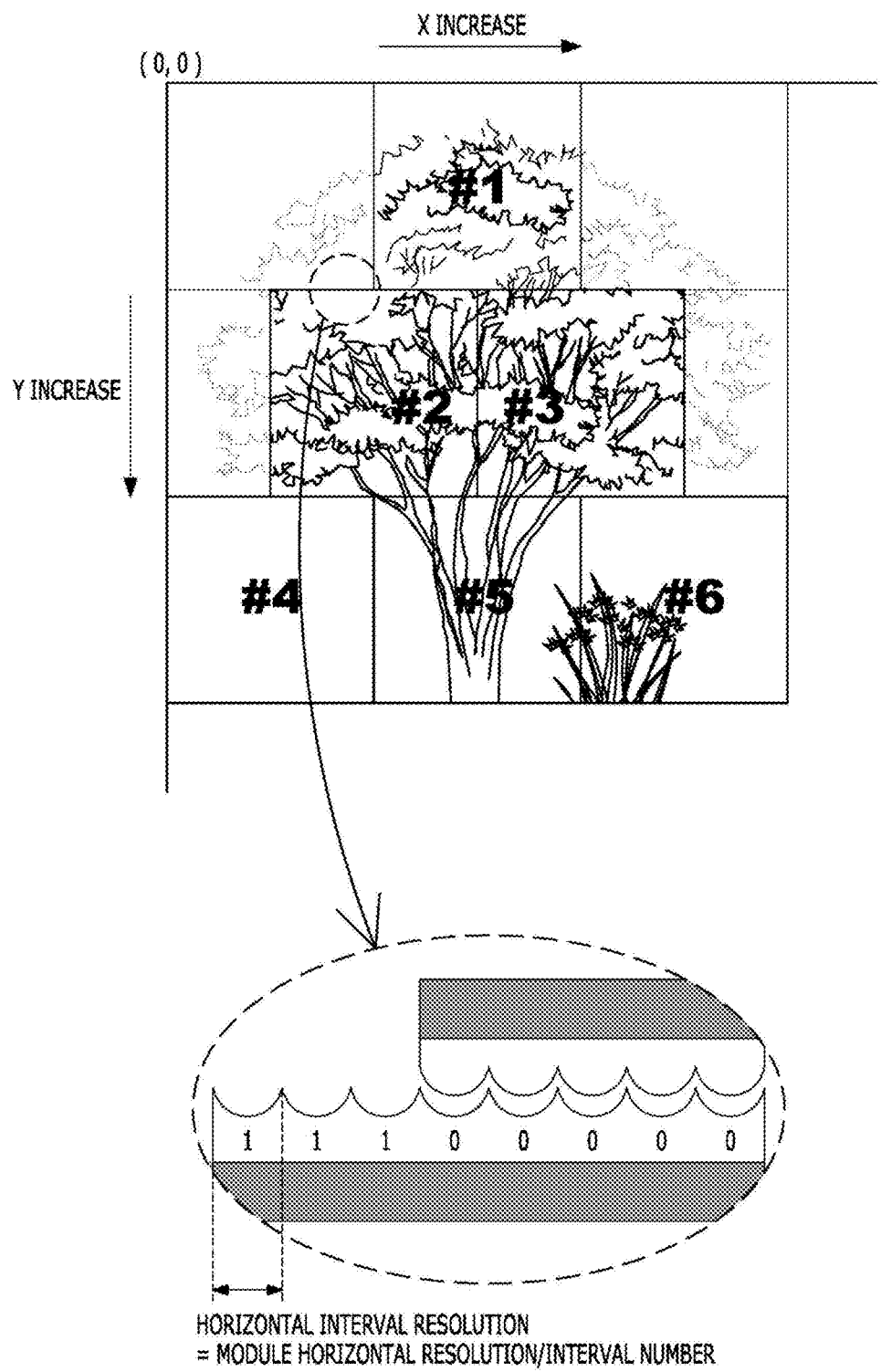
FIG. 10 is a diagram for describing an example which calculates arrangement coordinates of division images in a system chip, in a case where staggered surfaces between adjacent display modules are in an X-axis direction.

FIG. 10 is a diagram for describing an example which calculates arrangement coordinates of division images in a system chip, in a case where staggered surfaces between adjacent display modules are in an X-axis direction.

Referring to FIG. 10, a system chip SET may calculate arrangement coordinates of first to sixth display modules #1 to #6 configuring a free-form tiling screen, based on pieces of connection state information obtained from the first to sixth display modules #1 to #6.

The system chip SET may calculate arrangement coordinates of the other display modules #2 to #6 with respect to a first display module #1. In this case, the first display module #1 may be a reference display module for calculating a coordinate value. The system chip SET may calculate the arrangement coordinates of the other display modules #2 to #6, based on connection state information about at least some of the other display modules #2 to #6 and arrangement coordinates (x,y) of the first display module #1 known previously. The reference display module is not limited to the first display module #1 and may be selected from among the other display modules #2 to #6.

The system chip SET may subtract "horizontal interval resolution*number of pieces of upper connection state information 0 of second display module #2" from left upper x coordinates of the first display module #1 to calculate left upper x coordinates of a second display module #2. The horizontal interval resolution may be a value obtained by dividing a horizontal resolution of the second display module #2 by an interval number (i.e., the number of groove portions or protrusion portions). The system chip SET may add a vertical resolution of the first display module #1 to left upper y coordinates of the first display module #1 to calculate left upper y coordinates of the second display module #2.

The system chip SET may add a horizontal resolution of the second display module #2 to left upper x coordinates of the second display module #2 to calculate left upper x coordinates of the third display module #3. The system chip SET may calculate the left upper y coordinates of the second display module #2 as left upper y coordinates of the third display module #3.

The system chip SET may subtract "horizontal interval resolution*number of pieces of upper connection state information 0 of fourth display module #4" from left upper x coordinates of the second display module #2 to calculate left upper x coordinates of a fourth display module #4. The horizontal interval resolution may be a value obtained by dividing a horizontal resolution of the fourth display module #4 by an interval number (i.e., the number of groove portions or protrusion portions). The system chip SET may add a vertical resolution of the second display module #2 to left upper y coordinates of the second display module #2 to calculate left upper y coordinates of the fourth display module #4.

The system chip SET may add a horizontal resolution of the fourth display module #4 to left upper x coordinates of the fourth display module #4 to calculate left upper x coordinates of the fifth display module #5. The system chip SET may calculate the left upper y coordinates of the fourth display module #4 as left upper y coordinates of the fifth display module #5.

The system chip SET may add a horizontal resolution of the fifth display module #5 to left upper x coordinates of the fifth display module #5 to calculate left upper x coordinates of the sixth display module #6. The system chip SET may calculate the left upper y coordinates of the fifth display module #5 as left upper y coordinates of the sixth display module #6.

As described above, the system chip SET may calculate arrangement coordinates of the first to sixth display modules #1 to #6, and then, may change display positions of division images, based on the arrangement coordinates of the first to sixth display modules #1 to #6.

Figure 11:
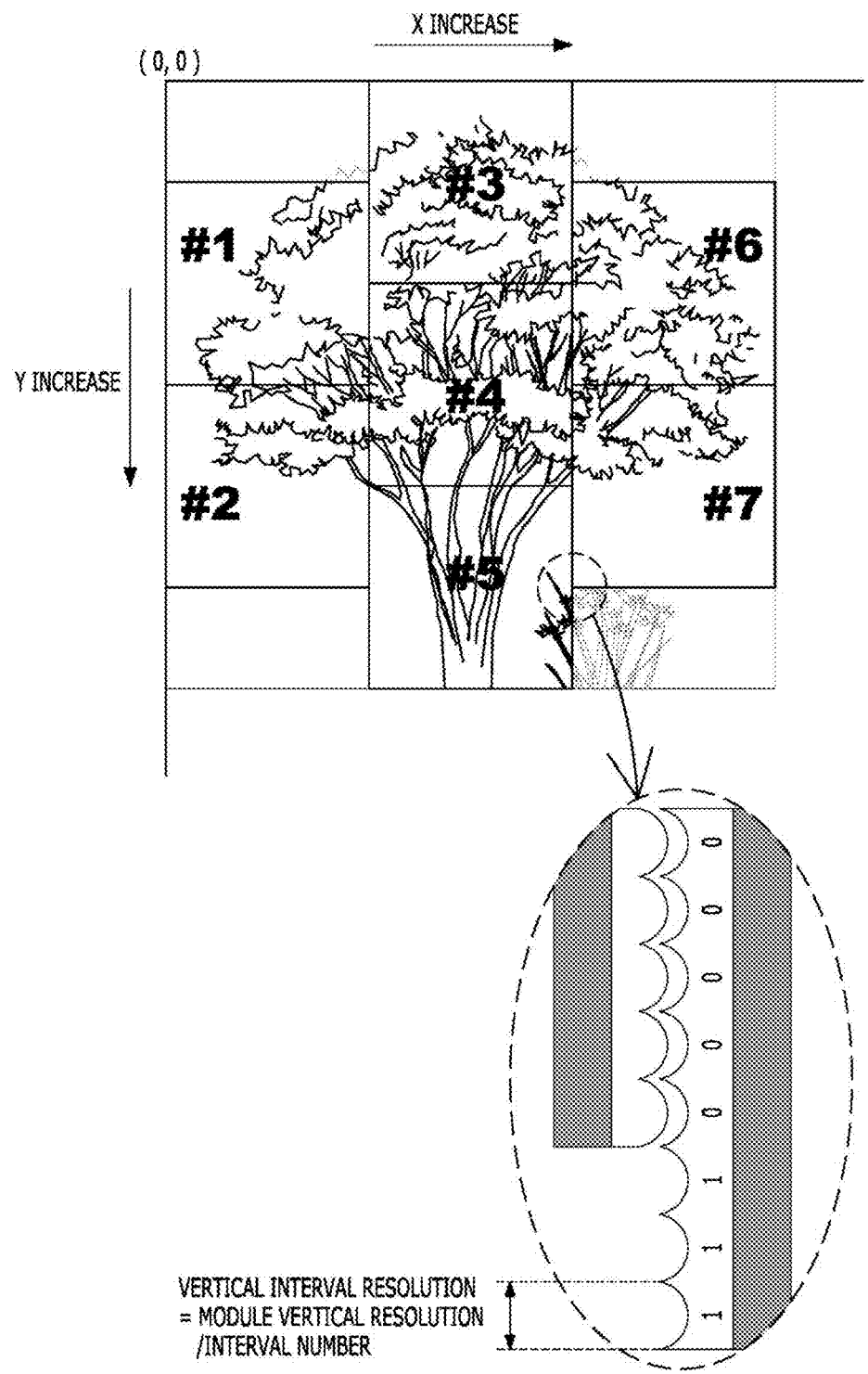
FIG. 11 is a diagram for describing an example which calculates arrangement coordinates of division images in a system chip, in a case where staggered surfaces between adjacent display modules are in a Y-axis direction.

FIG. 11 is a diagram for describing an example which calculates arrangement coordinates of division images in a system chip, in a case where staggered surfaces between adjacent display modules are in a Y-axis direction.

Referring to FIG. 11, a system chip SET may calculate arrangement coordinates of first to seventh display modules #1 to #7 configuring a free-form tiling screen, based on pieces of connection state information obtained from the first to seventh display modules #1 to #7.

The system chip SET may calculate arrangement coordinates of the other display modules #2 to #7 with respect to the first display module #1. In this case, the first display module #1 may be a reference display module for calculating a coordinate value. The system chip SET may calculate the arrangement coordinates of the other display modules #2 to #7, based on connection state information about at least some of the other display modules #2 to #7 and arrangement coordinates (x,y) of the first display module #1 known previously. The reference display module is not limited to the first display module #1 and may be selected from among the other display modules #2 to #7.

The system chip SET may calculate left upper x coordinates of the first display module #1 as left upper x coordinates of the second display module #2. The system chip SET may add a vertical resolution of the first display module #1 to left upper y coordinates of the first display module #1 to calculate left upper y coordinates of the second display module #2.

The system chip SET may add a horizontal resolution of the first display module #1 to left upper x coordinates of the first display module #1 to calculate left upper x coordinates of the third display module #3. The system chip SET may subtract "vertical interval resolution*number of pieces of left connection state information 0 of third display module #3" from left upper y coordinates of the first display module #1 to calculate left upper y coordinates of the third display module #3. The vertical interval resolution may be a value obtained by dividing a vertical resolution of the third display module #3 by an interval number (i.e., the number of groove portions or protrusion portions).

The system chip SET may calculate left upper x coordinates of the third display module #3 as left upper x coordinates of the fourth display module #4. The system chip SET may add a vertical resolution of the third display module #3 to left upper y coordinates of the third display module #3 to calculate left upper y coordinates of the fourth display module #4.

The system chip SET may calculate left upper x coordinates of the fourth display module #4 as left upper x coordinates of the fifth display module #5. The system chip SET may add a vertical resolution of the fourth display module #4 to left upper y coordinates of the fourth display module #4 to calculate left upper y coordinates of the fifth display module #5.

The system chip SET may add a horizontal resolution of the third display module #3 to left upper x coordinates of the third display module #3 to calculate left upper x coordinates of the sixth display module #6. The system chip SET may subtract "vertical interval resolution*number of pieces of left connection state information 0 of sixth display module #6" from left upper y coordinates of the third display module #3 to calculate left upper y coordinates of the sixth display module #6. The vertical interval resolution may be a value obtained by dividing a vertical resolution of the sixth display module #6 by an interval number (i.e., the number of groove portions or protrusion portions).

The system chip SET may calculate left upper x coordinates of the sixth display module #6 as left upper x coordinates of the seventh display module #7. The system chip SET may add a vertical resolution of the sixth display module #6 to left upper y coordinates of the sixth display module #6 to calculate left upper y coordinates of the seventh display module #7.

As described above, the system chip SET may calculate arrangement coordinates of the first to seventh display modules #1 to #7, and then, may change display positions of division images, based on the arrangement coordinates of the first to seventh display modules #1 to #7.

Figure 12:
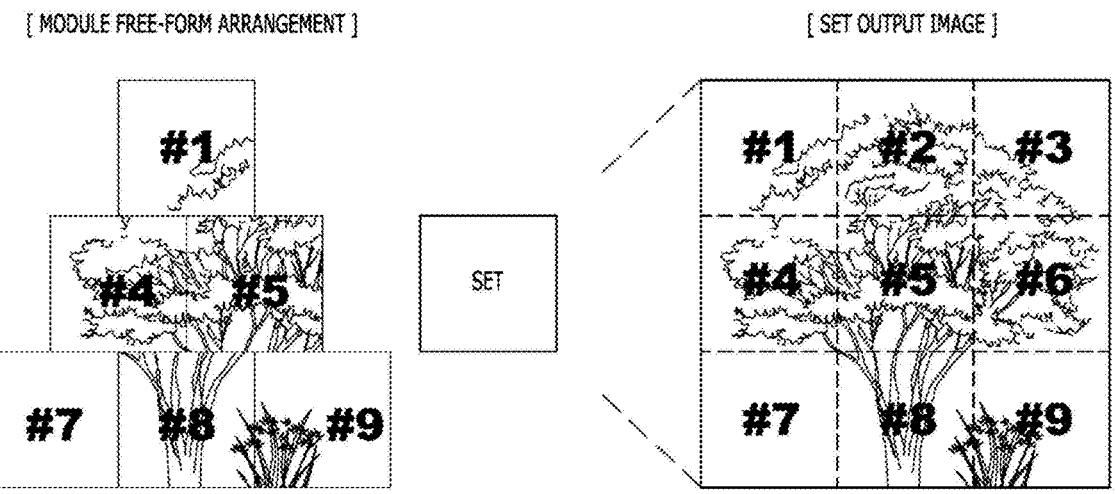
FIG. 12 is a diagram illustrating a case where an image is distorted and displayed on a tiling screen because display positions of division images are not changed despite a change in arrangement positions of display modules, in a comparative example of the present disclosure.

FIG. 12 is a diagram illustrating a case where an image is distorted and displayed on a tiling screen because display positions of division images are not changed despite a change in arrangement positions of display modules, in a comparative example of the present disclosure.

Referring to FIG. 12, in a case where a tiling screen based on first to ninth display modules #1 to #9 is reconfigured with six display modules #1, #4, #5, #7, #8, and #9 by a user, when display positions of division images are not changed based on changing of arrangement positions of display modules, an image may be distorted and displayed on a reconfigured tiling screen. In FIG. 12, image distortion may occur in three display modules #1, #4, and #5 where arrangement positions are changed.

Figure 13:
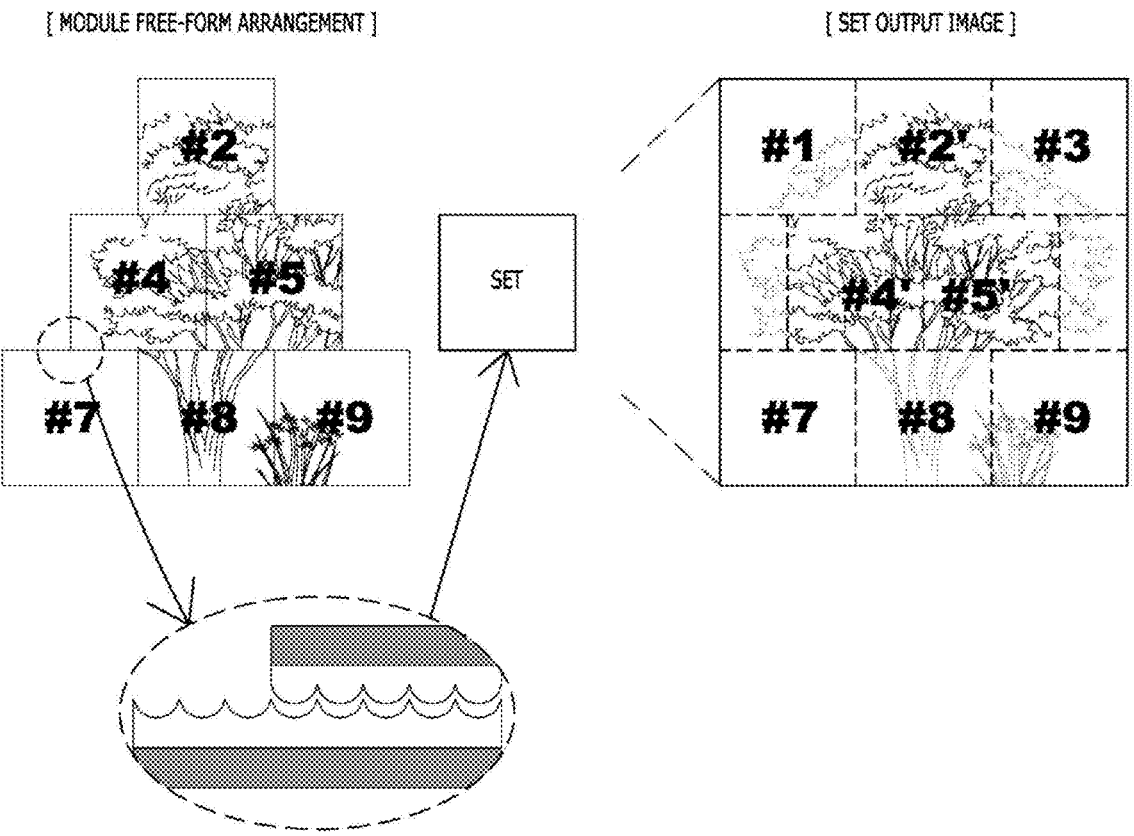
FIG. 13 is a diagram illustrating a case where display positions of division images are automatically changed based on pieces of module arrangement information about display modules, in an embodiment of the present disclosure.

FIG. 13 is a diagram illustrating a case where display positions of division images are automatically changed based on pieces of module arrangement information about display modules, in an embodiment of the present disclosure.

Referring to FIG. 13, in a case where a tiling screen based on first to ninth display modules #1 to #9 is reconfigured with six display modules #2, #4, #5, #7, #8, and #9 by a user, when display positions of division images are automatically changed based on changing of arrangement positions of display modules, an output image may be normally displayed on a reconfigured tiling screen. The system chip SET may adjust division images of the display modules #4 and #5 so as to differ from division images immediately before reconfiguration, based on module arrangement information about two display modules #4 and #5 where arrangement positions are changed, and thus, may prevent distortion of an output image.

The present embodiment may realize the following effects.

The tiling display apparatus according to the present embodiment may sense arrangement positions of display modules and may automatically adjust positions of division images, based on a sensing result thereof, thereby preventing a display image from being distorted on a free-form tiling screen.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A tiling display apparatus comprising:
a plurality of display modules coupled with one another to configure a tiling screen and display division images; and
a system circuit configured to change a display position of each of the division images, based on module arrangement information about each of the plurality of display modules,
wherein seam patterns are configured to be coupled with adjacent display modules are provided in border regions of each display module,
wherein each display module obtains, as the module arrangement information, connection state information about the seam patterns,
wherein the seam patterns include a plurality of protrusion portions and a plurality of groove portions to be engaged with the protrusion portions,
wherein a number of the plurality of protrusion portions corresponds to a number of bits of the connection state information,
wherein first connection terminals coupled with a high level logic power and second connection terminals coupled with a ground power are provided in the plurality of protrusion portions,
wherein third connection terminals coupled with the high level logic power and fourth connection terminals coupled with the ground power are provided in the plurality of groove portions,
wherein at least some of the first connection terminals are coupled with at least some of the fourth connection terminals, and
wherein at least some of the second connection terminals are coupled with at least some of the third connection terminals.

2. The tiling display apparatus of claim 1, wherein, a first border region of a first display module of the plurality of display modules is at least partially coupled with a second border region of a second display module of the plurality of display modules,
wherein a first seam pattern is provided in the first border region of the first display module, and a second seam pattern to be engaged with the first seam pattern is provided in the second border region of the second display module, and
wherein a shape of the first seam pattern is opposite to a shape of the second seam pattern.

3. The tiling display apparatus of claim 2, wherein the first seam pattern comprises the plurality of protrusion portions, and the second seam pattern comprises the plurality of groove portions,
wherein each of the plurality of protrusion portions has a convex shape toward an outer portion of a corresponding display module, and
wherein each of the plurality of groove portions has a concave shape toward an inner portion of a corresponding display module.

4. The tiling display apparatus of claim 2, wherein first connection state information about the first seam pattern is determined based on the number of first connection terminals coupled with the fourth connection terminals, and
wherein second connection state information about the second seam pattern is determined based on the number of third connection terminals coupled with the second connection terminals.

5. The tiling display apparatus of claim 1, wherein a number of the plurality of groove portions further corresponds to a number of bits of the connection state information.

6. The tiling display apparatus of claim 2, further comprising a plurality of engagement reinforcement portions provided in the first border region of the first display module and the second border region of the second display module to reinforce coupling between the first seam pattern and the second seam pattern.

7. The tiling display apparatus of claim 6, wherein each of the plurality of engagement reinforcement portions comprises:
a plurality of first polar magnets disposed in the first border region; and
a plurality of second polar magnets disposed in the second border region.

8. The tiling display apparatus of claim 2, further comprising:
a first analog-to-digital converter provided in the first border region of the first display module to convert first connection state information about the first seam pattern into a digital signal; and
a second analog-to-digital converter provided in the second border region of the second display module to convert second connection state information about the second seam pattern into a digital signal.

9. A display apparatus comprising:
a plurality of display modules including a first display module and a second display module adjacent to the first display module, each display module of the plurality of display modules configured to display images, each display module including:
a timing controller;
seam patterns at border regions, the seam patterns including a first seam pattern of a first type and a second seam pattern of a second type, the first seam pattern and the second seam pattern having different patterns from each other; and a system circuit configured to change a display position of each of the displayed images based on module arrangement information about each display module of the plurality of display modules,
- wherein the first seam pattern and the second seam pattern include a complementary shape when, in operation, couples the first seam pattern of the first display module with the second seam pattern of the second display module at common border regions of the first and second display modules,
- wherein each display module obtains, as the module arrangement information, connection state information about the seam patterns,
- wherein the first seam pattern includes a plurality of protrusion portions, and
- wherein a number of protrusion portions of the plurality of protrusion portions corresponds to a number of bits of the connection state information.

10. The display apparatus of claim 9, wherein the adjacent display modules of the plurality of display modules are coupled with one another through a bidirectional first interface circuit,
- wherein at least one display module of the plurality of display modules interface with the system circuit through a bidirectional first interface circuit.

11. The display apparatus of claim 9,
- wherein a width of one protrusion portion of the plurality of protrusion portions is indicative of either a horizontal interval resolution or a vertical interval resolution.

12. The display apparatus of claim 9, wherein the second seam pattern includes a plurality of groove portions, and
- wherein a width of one groove portion of the plurality of groove portions is indicative of either a horizontal interval resolution or a vertical interval resolution.

13. The display apparatus of claim 9, wherein the second seam pattern includes a plurality of groove portions, and
- wherein a number of groove portions of the plurality of groove portions corresponds to a number of bits of the connection state information.

14. The display apparatus of claim 9, wherein the seam patterns include engagement reinforcement portions having a first polar magnet and a second polar magnet,
- wherein, in operation, the first polar magnet of the first seam pattern of the first display module magnetically engages with the second polar magnet of the second seam pattern of the second display module.

15. The display apparatus of claim 9, wherein the first seam pattern includes first connection terminals coupled with a high level logic power and second connection terminals coupled with a ground power,
- wherein the second seam pattern includes third connection terminals coupled with the high level logic power and fourth connection terminals coupled with the ground power,
- wherein at least some of the first connection terminals of the first seam pattern of the first display module are coupled with at least some of the fourth connection terminals of the second seam pattern of the second display module.

16. The display apparatus of claim 15, wherein at least some of the second connection terminals of the first seam pattern of the first display module are coupled with at least some of the third connection terminals of the second seam pattern of the second display module.

17. The display apparatus of claim 16, wherein the connection state information includes first connection state information about the first seam pattern that is determined based on the number of first connection terminals connected with the fourth connection terminals, and
- wherein the connection state information further includes second connection state information about the second seam pattern that is determined based on a number of third connection terminals connected with the second connection terminals.

* * * * *